United States Patent
Macabitas et al.

[11] Patent Number: 5,944,249
[45] Date of Patent: Aug. 31, 1999

[54] WIRE BONDING CAPILLARY WITH BRACING COMPONENT

[75] Inventors: George U. Macabitas; Sammy Tan; Luzviminda A. Macabitas, all of Baguio, Philippines

[73] Assignee: Texas Instruments Incorporated, Dallas, Tex.

[21] Appl. No.: 08/989,960

[22] Filed: Dec. 12, 1997

Related U.S. Application Data

[60] Provisional application No. 60/033,327, Dec. 12, 1996.
[51] Int. Cl.⁶ .................................................. H01L 21/60
[52] U.S. Cl. ........................................ 228/180.5; 228/4.5
[58] Field of Search .................... 228/4.5, 180.5, 228/1.1

[56] References Cited

U.S. PATENT DOCUMENTS

| | | | |
|---|---|---|---|
| 4,958,762 | 9/1990 | Shimizu et al. .......................... | 228/4.5 |
| 5,275,324 | 1/1994 | Yamazaki et al. ........................ | 228/4.5 |
| 5,368,216 | 11/1994 | Sakakura et al. ......................... | 228/4.5 |
| 5,544,804 | 8/1996 | Test et al. ............................. | 228/180.5 |
| 5,829,663 | 11/1998 | Khelemsky et al. ....................... | 228/1.1 |

FOREIGN PATENT DOCUMENTS 6-140457   5/1994   Japan .................................. 228/180.5

*Primary Examiner*—Patrick Ryan
*Assistant Examiner*—Jeffrey T. Knapp
*Attorney, Agent, or Firm*—W. James Brady III; Richard L. Donaldson

[57] ABSTRACT

A capillary (22) for use in wire bonding is provided. The capillary (22) includes a tubular body (24) having a longitudinal axis (AA). At least one notch (42, 62, 64) is formed in the tubular body. The angular alignment of the capillary (22) and capillary face (42) correspond to the angular position of each notch (42, 62, 64), thus allowing the position of the capillary face (42) to be controlled by inserting the capillary (22) into a capillary channel (44) having a wedge (32) that mates with the notch (42, 62, 64).

20 Claims, 3 Drawing Sheets

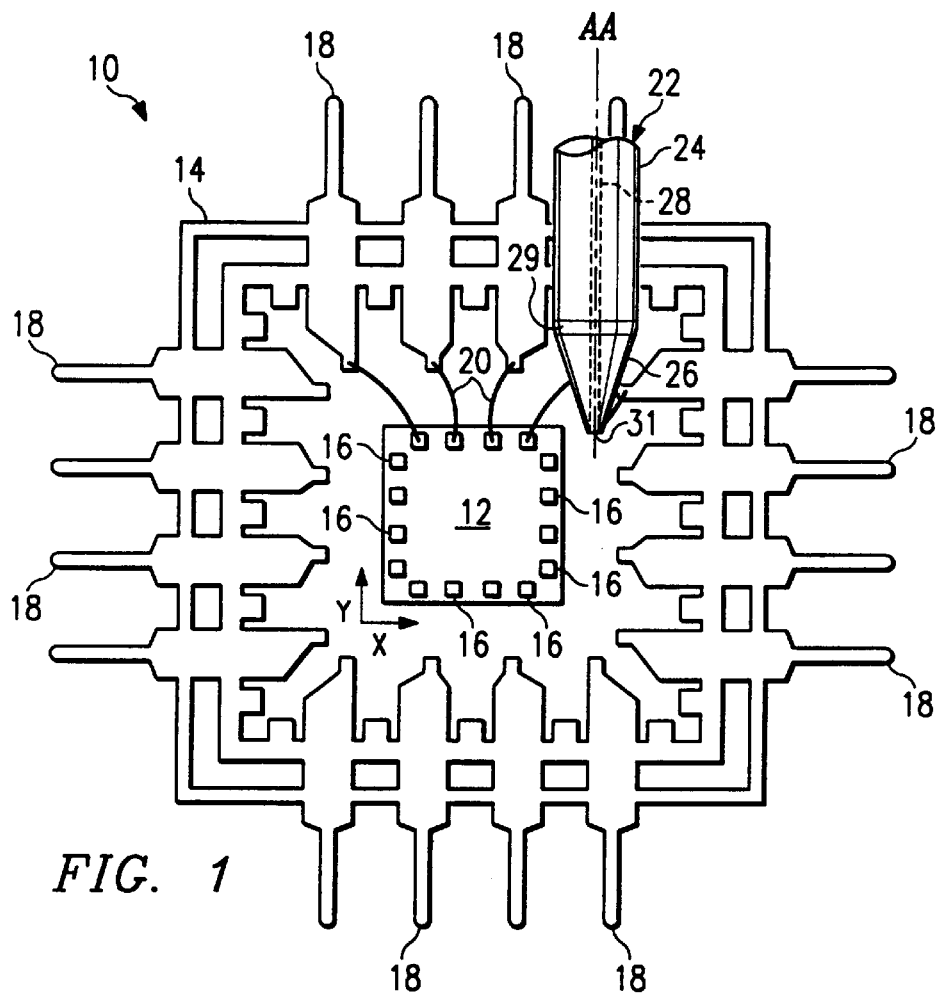
FIG. 1
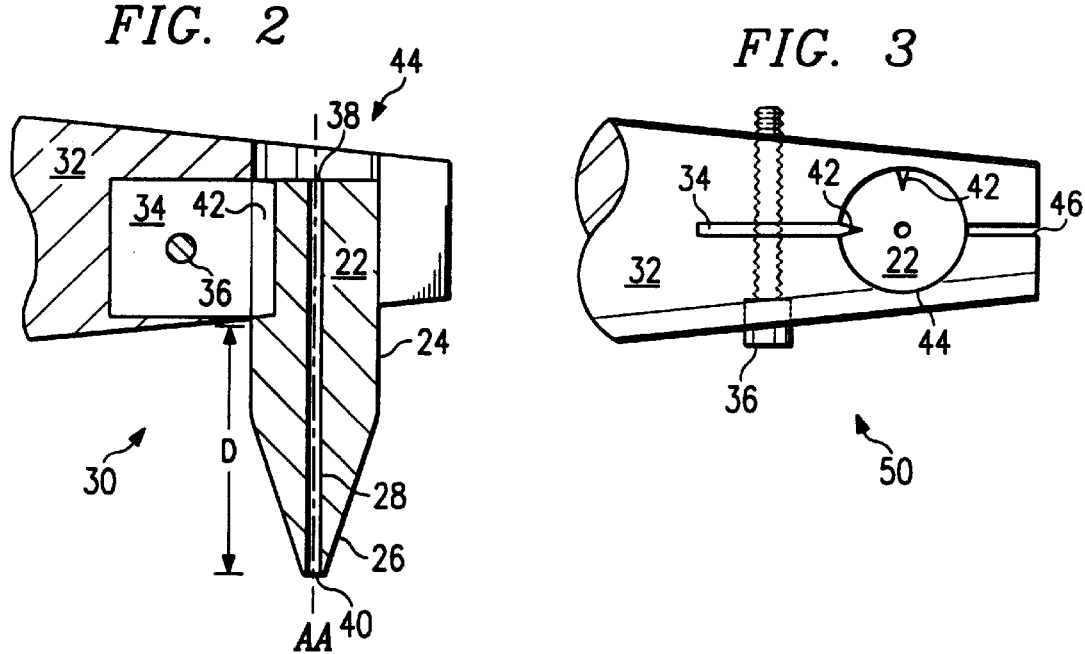
FIG. 2
FIG. 3

WIRE BONDING CAPILLARY WITH BRACING COMPONENT

This application claims priority under 35 USC § 119(e)(1) of provisional application No. 60/033,327 filed Dec. 12, 1996.

TECHNICAL FIELD OF THE INVENTION

The present invention generally relates to the manufacture of electronic integrated circuit chip packages and, more particularly, to a wire bonding capillary with a bracing component for making electrical connections between the integrated circuit chip and a lead frame.

BACKGROUND OF THE INVENTION

An integrated circuit chip package typically comprises an encapsulated silicon wafer bearing an integrated circuit, and a lead frame. An integrated circuit is etched into the silicon wafer and includes a number of bond pads which may be positioned about a perimeter of the silicon wafer. The lead frame typically comprises a support structure for the silicon wafer and electrical leads or "pins" that may be used to form electrical connections between the lead frame and other electrical devices. Electrical connections are made between the integrated circuit and the lead frame by bonding a metallic wire, typically gold, to the bond pads of the integrated circuit and to the pins of the lead frame.

A wire bonding machine is typically used to bond the wire to the bond pads and lead frame pins. The bonding wire may be threaded through a capillary which is mounted to a transducer of the wire bonding machine. The transducer may be manipulated to move the capillary both vertically and horizontally. The transducer or another energy source, such as a hydrogen flame, is then used to apply energy to the end of the bonding wire which protrudes from an exit end of the capillary. This applied energy may cause the wire to soften or melt. The molten wire may form the shape of a ball which is placed on a target bond pad by manipulating the transducer to move the capillary.

The exit end of a wire bonding capillary is often referred to as the capillary face. Previous capillaries have had a circular face. A disadvantage of having a capillary with a circular face is that the spacing between bond pads may be limited by the space required for the capillary. If the bond pad spacing is too close, the capillary may contact and damage a ball bond which has been previously made at an adjacent bond pad. One method for resolving this problem is to use a wire bonding capillary with a non-circular face. This type of approach is shown, for example, in U.S. Pat. No. 5,544,804 issued to Test et al. (hereinafter "Test"). A capillary made per the invention disclosed in Test may be referred to as a BowTI™ capillary.

In a wire bonding machine, two BowTI™ capillaries may be employed. One capillary is used to make the bonds in the X direction of a given package and the other capillary is used to make the bonds in the Y direction of the package.

A problem arising from the use of capillaries having non-circular faces is the need for precise alignment of the longitudinal axis of the capillary face along either the X or Y axis of the lead frame, or along the longitudinal axis of a target lead, as necessary. Precise alignment of non-circular capillaries is especially difficult due to the relatively small size of a typical capillary face (e.g., 4–8 mil).

Further, with respect to non-circular capillary faces, precise alignment of the longitudinal axis of the capillary face during installation of the capillary into the transducer of a wire bonding machine is difficult. Moreover, it is difficult to accurately rotate the capillary to a precise angular alignment in which the longitudinal axis of the capillary face is offset from either the X or Y axis of the lead frame by a precise angular amount. It is difficult to check the alignment of the capillary at installation or during or after rotation of the capillary. Improper alignment of the capillary can lead to defective wire bonds during the manufacturing process.

In addition to the problems noted above with respect to alignment of the capillary face, the capillary must also be aligned longitudinally, such that a predetermined length of the capillary extends in the direction underneath the transducer. This distance must usually be set using calibrated tools.

SUMMARY OF THE INVENTION

It is an object of the present invention to solve the problems associated with known capillaries used in wire bonding.

It is a further object of the present invention to provide a capillary for a wire bonding machine which may be easily aligned during installation of the capillary into the wire bonding machine.

To accomplish this and other objects of the present invention, a capillary is provided for use in wire bonding. The capillary includes a tubular body having a longitudinal axis. At least one notch is formed in the tubular body. The angular alignment of the capillary and capillary face correspond to the angular position of each notch, thus allowing the position of the capillary face to be controlled by inserting the capillary into a capillary channel having a wedge that mates with the notch.

The present invention provides many important technical advantages. One important technical advantage of the present invention is that no additional steps need to be performed to verify proper orientation of an irregularly-shaped capillary face. Installation of the capillary such that a notch on the capillary mates with a corresponding wedge ensures the proper orientation of the capillary face.

Another important technical advantage of the present invention is that correct orientation of the capillary face may be determined by verifying that the capillary has been inserted into the capillary channel with the predetermined locations of the wedge and notch. The wedge and notch can be used to prevent inadvertent axial motion of the capillary.

Another important technical advantage of the present invention is that the wedge and notch may be used to control the distance which the capillary extends beneath the transducer. The wedge and notch may be designed such that the capillary extends by the proper amount when the capillary is fully inserted to the extent that the wedge mates with the notch, thus eliminating the need for special calibration tools.

BRIEF DESCRIPTION OF THE DRAWINGS

For a more complete understanding of the present invention and for further features and advantages, reference is now made to the following description taken in conjunction with the accompanying drawings, in which:

FIG. 1 is a diagram of an integrated circuit package showing the use of a capillary 22 constructed in accordance with teachings of the present invention;

FIG. 2 is a cross-sectional view of capillary 22 shown in FIG. 1;

FIG. 3 is an overhead view of capillary 22 shown in FIG. 1;

DETAILED DESCRIPTION OF THE INVENTION

Figure 4A:
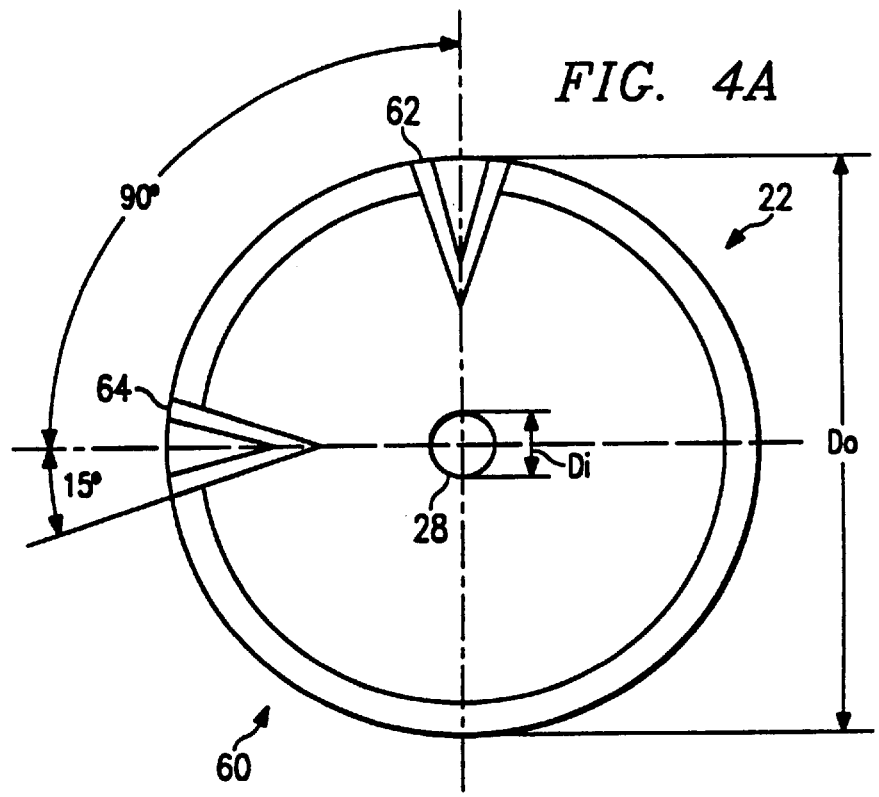
FIGS. 4A and 4B are detail drawings of capillary 22 shown in FIG. 1.

Preferred embodiments of the present invention are illustrated in the FIGURES, like numerals being used to refer to like and corresponding parts of the various drawings.

FIG. 1 is a diagram of an integrated circuit package 10 showing the use of a capillary 22 constructed in accordance with teachings of the present invention. Integrated circuit package 10 includes silicon chip 12 supported by lead frame 14. Bond pads 16 on silicon chip 12 are electrically coupled to lead pins 18 of lead frame 14 by gold wire 20. Gold wire 20 is applied and bonded to bond pads 16 and lead pins 18 by capillary 22.

Silicon chip 12 is a wafer of silicon material that has been sliced from a silicon crystal. Silicon chip 12 may also be a layer of amorphous silicon or other suitable materials that may be used as a substrate for an integrated circuit. An integrated circuit (not explicitly shown) is incorporated into silicon chip 12 by processes such as vapor phase epitaxy, liquid phase epitaxy, photo lithography, laser lithography, ion implantation, doping, and other suitable processes. The integrated circuit of silicon chip 12 is electrically coupled to bond pads 16.

Bond pads 16 are metallic pads formed around the periphery of silicon chip 12 by a suitable method, such as by evaporation of aluminum onto silicon chip 12. Bond pads 16 are typically spaced around the periphery of silicon wafer 12. In applications utilizing the present invention, the spacing between bond pads 16 may be 0.003 inches or less.

Gold wire 20 is used to electrically couple bond pads 16 to lead pins 18. Gold wire 20 may alternately comprise many other suitable materials, such as silver wire, copper wire, or alloys containing gold, silver or copper.

Capillary 22 is a BowTI™ capillary that is used to connect gold wire 20 to bond pads 16 and lead pins 18. Capillary 22 has a tubular body comprising a shaft portion 24 which is integral with a capillary tip 26. Capillary 22 has a longitudinal axis in the general direction shown by line "AA" extending through the interior bore 28 of the capillary. Gold wire 20 may be inserted through interior bore 28 of capillary 12 so as to exit from capillary tip 26.

Shaft portion 24 is cylindrical in shape and has a circular cross section. However, other shapes may be used so long as the bonding wire may be threaded through interior bore 28 of capillary 22. For example, the capillary may have a rectangular or elliptical cross section. Preferably, the interior of capillary 22 is defined by an inner diameter $D_i$ and an outer diameter $D_o$. Preferably, inner diameter $D_i$ is constant throughout an entire length of capillary 10. However, if capillary 10 has a constant wall thickness, then $D_i$ will vary accordingly with variations in $D_o$.

Tip portion 26 is tapered from a first point 29, where tip portion 26 meets shaft portion 24, to a second point 31 located at the capillary face of capillary 22. Preferably, the outer diameter of tip portion 26 at first point 29 is equal to $D_o$ of shaft portion 24. Preferably, the tip portion 26 at second point 31 has a predetermined shape that is characteristic of BowTI™ capillaries. Capillary 22 may be formed from many suitable materials. However, it is preferable that capillary 22 is formed from a high-strength material.

In operation, capillary 22 is used to apply gold wire 20 to bond pads 16 and lead pins 18. Capillary 22 is placed on a first bond pad 16 or a first lead pin 18. A bond is then formed between the first bond pad 16 or first lead pin 18 and the gold wire 20, either by preheating gold wire 20 to melting before placing it on the first bond pad 16 or the first lead pin 18, preheating the first bond pad 16 or the first lead pin 18, applying ultrasonic or other energy to capillary 22 from a transducer (not explicitly shown), or by many other suitable methods.

After a bond has been formed at the first bond pad 16 or the first lead pin 18, capillary 22 is then moved to a corresponding first lead pin 18 or first bond pad 16, respectively. For example, if the first bond was formed at a first lead pin 18, the second bond will be formed at a first bond pad 16 corresponding to the first lead pin 18 with the first bond. In this manner, the lead pins and bond pads may be electrically coupled. Similar connections are formed between all other bond pads and lead pins of integrated circuit package 10, without the need for verifying the axial orientation of capillary 22. The axial orientation of capillary 22 is fixed by a locking device and a bracing component, as shown in FIG. 2.

FIG. 2 is a cross-sectional view 30 of capillary 22 of FIG. 1, as secured in a transducer 32 of a wire bonding machine (not explicitly shown). Capillary 22 is secured within a capillary channel 44 of transducer 32 by a locking device 34 and a bolt 36. Locking device 34 is an inset to transducer 32 that extends into capillary channel 44 and mates with a bracing component 42 of capillary 22. Gold wire 20 may be fed into channel entrance 38, through channel 28, and out of capillary face 40, so as to be applied to bond pads 16 and lead pins 18 of FIG. 1.

Bracing component 42 may comprise a notch that is machined into the tubular body of capillary 22, and interacts with locking device 34 to prevent axial movement about the axis defined by line "AA." In addition, locking device 34 allows capillary 22 to be inserted into capillary channel 44 a predetermined distance, such that a shaft portion 24 and tip portion 26 of capillary 22 extend underneath transducer 32 by a distance "D" as shown in FIG. 2 when capillary 22 is fully inserted to the extent that locking device 34 mates with bracing component 42. Distance "D" is typically calibrated. Therefore, calibration procedures do not need to be performed for setting the length of capillary 22 that extends underneath transducer 32.

One of ordinary skill in the art will recognize that many suitable locking devices and bracing components may be used to secure capillary 22 within capillary channel 44 of transducer 32. For example, locking device 34 may be recessed from capillary channel 44, while bracing component 42 may be a mating protrusion from the shaft portion 24 of capillary 22. Likewise, a discrete locking device 34 may be omitted, and capillary channel 44 of transducer 32 may be machined to form a locking device 34. Furthermore, bracing component 42 may be a physically separate device that is inset into capillary 22, such as a pin.

FIG. 3 is an overhead view 50 of capillary 22 in the direction of channel entrance 38 showing features of the present invention. Overhead view 50 shows locking device 34 mating with bracing component 42 of capillary 22. Capillary 22 is located within capillary channel 44. In addition, slot 46 has been machined into transducer 32 through capillary channel 44 in order to hold locking device 34. Bolt 36 extends through transducer 32 and locking device 34, and causes the opposing sides of transducer 32 created by slot 46 to exert a force on capillary 22 and locking device 34. This force holds locking device 34 and capillary 22 in position, and prevents capillary 22 from sliding out of capillary channel 44.

As previously noted, the interaction between locking device 34 and bracing component 42 prevents capillary 22 from moving axially in capillary channel 44. Alternate embodiments of the present invention may require or allow relocation of the components shown in FIG. 3. For example, if locking device 34 is formed by machining a protuberance in capillary channel 44 that mates with bracing component 42, then slot 46 may not extend to the present location of locking device 34. Thus, bolt 36 would need to be relocated. Furthermore, locking device 34 could be replaced by bolt 36 if bolt 36 is relocated to contact with capillary 22 and if capillary 22 includes a bracing component 42 that mates with the tip of bolt 36.

Figure 4B:
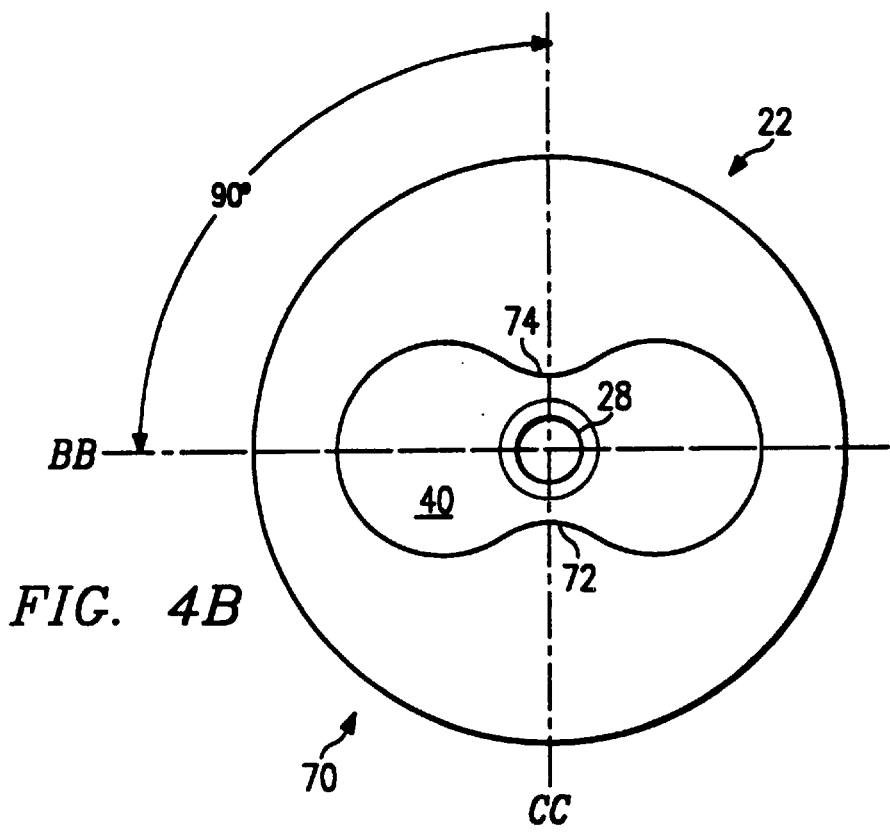

FIGS. 4A and 4B are detail drawings of capillary 22 showing features of the present invention. FIG. 4A shows an overhead view 60 of capillary 22 in the direction of channel entrance 38 of FIG. 2. Gold wire 20 enters channel 28 of capillary 22 from the face shown in FIG. 4A.

As shown in FIG. 4A, capillary 22 may comprise two bracing components 62 and 64. Bracing component 62 is located 90 degrees axially from bracing component 64 in a clockwise direction. Bracing components 62 and 64 may comprise a notch machined into the tubular body of shaft portion 24. Alternately, the notch of bracing components 62 and 64 may be formed by other suitable methods, such as cutting, grinding, or casting. Interior bore 28 has a diameter $D_i$ that does not extend past the innermost point of bracing component 62 or 64, thus maintaining the integrity of the tubular body of shaft portion 24 of capillary 22. Shaft portion 24 has an exterior diameter $D_o$ as previously noted.

Bracing components 62 and 64 are used to determine and control the axial position of capillary 22. For example, capillary face 40 (not explicitly shown) may be irregularly shaped, such that it is necessary to orient an axis of capillary face 40 in a predetermined direction. Thus, selection of one of bracing components 62 and 64 may be used to control the orientation of the capillary face 40.

Likewise, if capillary face 40 is not irregularly shaped, bracing components 62 and 64 may have different axial lengths along shaft portion 24 of capillary 22, such that the distance "D" in FIG. 2 is different for bracing components 62 and 64. Thus, selection of one of bracing components 62 and 64 may be used to control the calibrated distance "D" of capillary 22 as installed in transducer 32.

FIG. 4B shows a bottom view 70 of capillary 22 in the direction of capillary face 40. Bottom view 70 reveals the characteristic shape of a BowTI™ capillary tip, having opposing concave surfaces 72 and 74. Axis "CC" bisects the center of concave surfaces 72 and 74, and also corresponds to the location of one of bracing components 62 and 64. Likewise, axis "BB" is perpendicular to axis "CC" and corresponds to the location of the other of bracing components 62 and 64 that does not lie on axis "CC."

A capillary 22 having a capillary face 40 as shown in FIG. 4B may be used to apply gold wire 20 to bond pads 16 and lead pins 18 of an integrated circuit 12 of FIG. 1 having a high-density of bond pads 16. For example, the spacing between bond pads 16 of some integrated circuits may be as little as 0.003 inches or less. For such integrated circuits, controlling the orientation of capillary face 40 is crucial in order to prevent bonds formed at adjacent bond pads from being inadvertently damaged during the bonding process.

The present invention may be used in a wire bonding machine having two or more capillaries 22, oriented so as to bond gold wire 20 to bond pads 16 and lead pins 18 in either the X axis or Y axis of a silicon chip 12 as shown in FIG. 1. By using a capillary 22 having bracing components 62 and 64 as shown in FIG. 4A, the orientation of capillary face 40 may be easily controlled. Thus, additional steps for verifying capillary face orientation need not be performed after insertion of capillary 22 into capillary channel 44. Likewise, additional steps for calibrating distance "D" shown in FIG. 2, or for verifying the orientation of the capillary face 40 during the bonding operation do not need to be performed.

Figure 5:
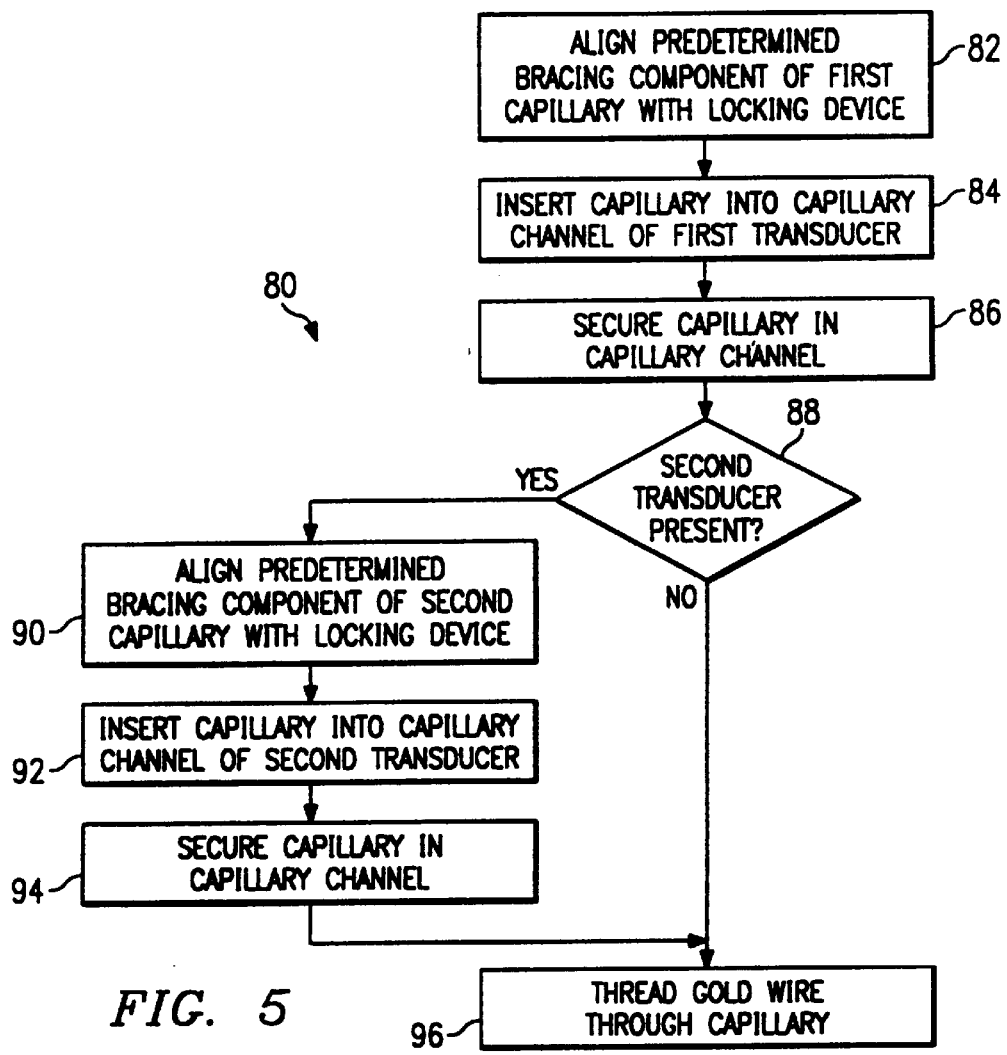
FIG. 5 is a flow chart of a method for angularly aligning a capillary in accordance with the teachings of the present invention.

FIG. 5 is a flow chart 80 of a method for angularly aligning a capillary in accordance with the teachings of the present invention. Flow chart 80 begins with step 82, in which the bracing component of a capillary is aligned with a locking device in the capillary channel of a transducer. For example, if the bracing component and locking device are similar to bracing component 42 and locking device 34 of FIG. 2, then step 82 may include inserting locking device 34 into slot 46 of transducer 32. Step 82 may also include selecting the correct bracing component for capillary 22 so that capillary face 40 has an appropriate orientation.

At step 84, the capillary is inserted into the capillary channel of the transducer. The capillary may be fully inserted if the locking device and bracing component are used to control the distance "D" which the capillary extends underneath the first transducer, as shown in FIG. 2. Otherwise, additional procedures may need to be used to control the distance "D," such as using calibrated blocks or guides.

At step 86, the capillary is secured into the capillary channel. For example, this step may include tightening bolt 36 of FIGS. 2 and 3 so that locking device 34 and capillary 22 are held in place between the opposing sides of transducer 32 created by slot 46. At step 88, it is determined whether a second transducer is present, such as in a wire bonding machine having an "X" axis transducer and a "Y" axis transducer. If a second transducer is present, the method proceeds to step 90. Otherwise, the method proceeds to step 96.

At step 90, the bracing component of a second capillary is aligned with a locking device in the capillary channel of the second transducer. For example, if the bracing component and locking device are similar to bracing component 42 and locking device 34 of FIG. 2, then step 82 may include inserting locking device 34 into slot 46 of transducer 32. Step 90 may also include selecting the correct bracing component for capillary 22 so that capillary face 40 has an appropriate orientation.

At step 92, the second capillary is inserted into the capillary channel of the second transducer. The second capillary may be fully inserted if the locking device and bracing component are used to control the distance "D" which the capillary extends underneath the second transducer, as shown in FIG. 2. Otherwise, additional procedures may need to be used to control the distance "D," such as using calibrated blocks or guides.

At step 94, the capillary is secured into the capillary channel. For example, this step may include tightening bolt 36 of FIGS. 2 and 3 so that locking device 34 and capillary 22 are held in place between the opposing sides of transducer 32 created by slot 46. The method then proceeds to step 96.

At step 96, gold wire is threaded through the capillary, or each of the capillaries if two are present. The wire bonding machine is then prepared for operation, without the need for further verification of the orientation of the capillary face.

Figure 6:
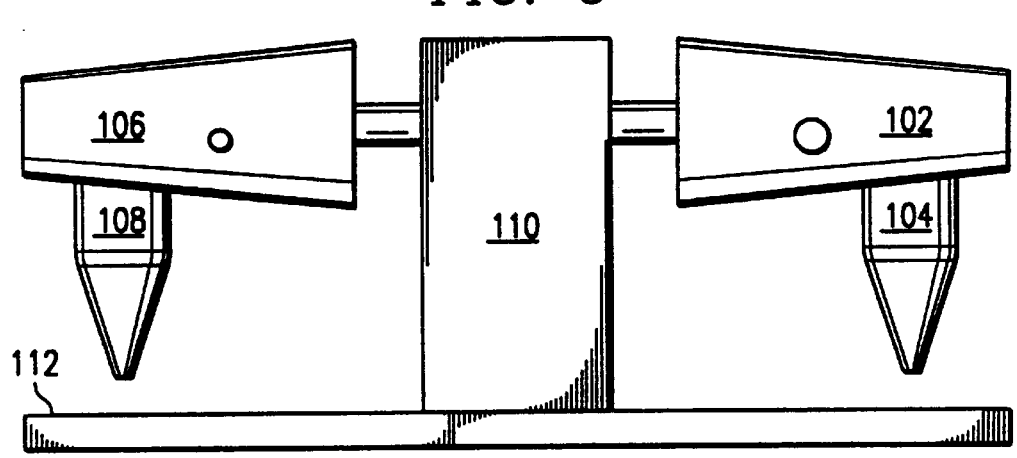
FIG. 6 is a diagram showing a wire bonding machine 100 having two capillaries 104 and 108 incorporating concepts of the present invention.

FIG. 6 is a diagram showing a wire bonding machine 100 having two capillaries and incorporating concepts of the present invention. Wire bonding machine 100 includes first transducer 102 with first capillary 104 and second transducer 106 with second capillary 108. First transducer 102 and second transducer 106 are coupled to wire bonding controller 110, which is operable to control the placement of first transducer 102 and second transducer 106, and to control the function of wire bonding machine 110.

First capillary 104 and second capillary 108 are used to bond gold wire to bond pads and lead pins of integrated circuits on circuit conveyor 112. Circuit conveyor 112 is coupled to wire bonding controller 110, which controls circuit conveyor 112 to regulate the position of integrated circuits under first capillary 104 and second capillary 108.

In operation, wire bonding machine 100 bonds wire connections between the bond pads and lead pins of the integrated circuits on circuit conveyor 112. One of capillaries 104 and 108 are used to form bonds to bond pads and lead pins that lie along the "X" axis of the integrated circuits, as shown in FIG. 1, and the other of capillaries 104 and 108 is used to form bonds to bond pads and lead pins that lie along the "Y" axis. In order to form bonds without inadvertently damaging adjacent bonds that have already been formed, capillaries 104 and 108 have capillary faces similar to capillary face 40 of FIG. 4B. The capillary faces of capillaries 104 and 108 are aligned in accordance with the teachings of the present invention prior to initiation of wire bonding.

One of ordinary skill in the art will recognize that various substitutions, alterations, or modifications may be made without departing from the spirit or scope of the present invention. The number and shape of locking devices and bracing components used may be varied to provide flexibility in both the axial orientation of the capillary face and the distance which the capillary extends from the transducer. Likewise, the number of transducers may be varied from one to any suitable number.

The present invention provides many technical advantages. One technical advantage of the present invention is that no additional steps need to be performed to verify proper orientation of an irregularly-shaped capillary face. Correct orientation of the capillary face may be determined by verifying that the capillary has been inserted into the capillary channel with the predetermined locations of the locking device and bracing component. The locking device and bracing component can be used to prevent inadvertent axial motion of the capillary. Furthermore, the locking device and bracing component may be used to control the distance which the capillary extends beneath the transducer.

Although the present invention has been described in detail, it should be understood that various changes, substitutions, and alterations can be made hereto without departing from the spirit and scope of the invention as defined by the appended claims.

What is claimed is:

1. A wire bonding machine comprising:
    a source of bonding wire;
    a first capillary for guiding the bonding wire to a first target;
    a first bracing component incorporated into the first capillary; and
    a first locking device incorporated into the wire bonding machine.

2. The wire bonding machine of claim 1 further comprising:
    a second capillary for guiding the bonding wire to a second target;
    a second bracing component incorporated into the second capillary; and
    a second locking device incorporated into the wire bonding machine.

3. The wire bonding machine of claim 2 wherein the first target is oriented at a predetermined angular position relative to the second target.

4. A method for angularly aligning a capillary, the method comprising the steps of:
    aligning a first capillary such that a first bracing device of the first capillary interlocks with a first locking device of a wire bonding machine; and
    inserting the first capillary into the wire bonding machine.

5. The method of claim 4 wherein the aligning step comprises aligning the first capillary such that the first bracing device of the first capillary interlocks with the first locking device within a first capillary channel of the wire bonding machine.

6. The method of claim 4 wherein the inserting step further comprises inserting the first capillary into a capillary channel of a first transducer of the wire bonding machine.

7. The method of claim 4 further comprising the steps of:
    aligning a second capillary such that a second bracing device of the second capillary interlocks with a second locking device of a wire bonding machine; and
    inserting the second capillary into the wire bonding machine.

8. The method of claim 7 wherein the aligning the second capillary step comprises aligning the second capillary such that the second bracing device of the second capillary interlocks with the second locking device within a second capillary channel of the wire bonding machine.

9. The method of claim 7 wherein the inserting the second capillary step further comprises inserting the second capillary into a capillary channel of a second transducer of the wire bonding machine.

10. A capillary for use in wire bonding, the capillary comprising:
    a tubular body having a longitudinal axis; and
    at least one bracing component incorporated into the tubular body, wherein an angular alignment of the capillary corresponds to an angular position of the bracing component about the longitudinal axis of the tubular body.

11. The capillary of claim 10 wherein the bracing component comprises a first bracing component and a second bracing component, the first bracing component being angularly offset from the second bracing component.

12. The capillary of claim 10 wherein the bracing component comprises a first bracing component corresponding to a first predetermined angular alignment of the capillary and a second bracing component corresponding to a second predetermined angular alignment of the capillary.

13. The capillary of claim 10 wherein the bracing component is a notch formed in the tubular body of the capillary.

14. The capillary of claim 10 wherein the bracing component is a protrusion formed from the tubular body of the capillary.

15. The capillary of claim 10, wherein the bracing component is an inset in the tubular body of the capillary.

16. The capillary of claim 10 further comprising a locking device operable to mate with the bracing component so as to prevent the capillary from moving in an angular direction.

17. The capillary of claim 16 wherein the locking device is a transducer having a capillary channel that is configured to hold the capillary.

18. The capillary of claim 16 further comprising:

a transducer having a capillary channel that is configured to hold the capillary; and the locking device is an inset to the transducer.

19. The capillary of claim 18 wherein the inset to the transducer forms a protuberance into the capillary channel, the protuberance forming the locking device, and wherein the bracing component further comprises a notch in the tubular body of the capillary configured to mate with the protuberance of the inset.

20. The capillary of claim 18 wherein the inset to the transducer forms a notch extending into the transducer from the capillary channel, the notch forming the locking device, and wherein the bracing component further comprises a protuberance from the tubular body of the capillary configured to mate with the notch of the transducer.

* * * * *